United States Patent

Fulford, Jr. et al.

[11] Patent Number: 5,923,983
[45] Date of Patent: *Jul. 13, 1999

[54] INTEGRATED CIRCUIT GATE CONDUCTOR HAVING A GATE DIELECTRIC WHICH IS SUBSTANTIALLY RESISTANT TO HOT CARRIER EFFECTS

[75] Inventors: H. Jim Fulford, Jr., Austin; Mark I. Gardner, Cedar Creek; Derick J. Wristers, Austin, all of Tex.

[73] Assignee: Advanced Micro Devices, Inc., Sunnyvale, Calif.

[ * ] Notice: This patent issued on a continued prosecution application filed under 37 CFR 1.53(d), and is subject to the twenty year patent term provisions of 35 U.S.C. 154(a)(2).

This patent is subject to a terminal disclaimer.

[21] Appl. No.: 08/771,871

[22] Filed: Dec. 23, 1996

[51] Int. Cl.$^6$ .................................................. H01L 21/336
[52] U.S. Cl. ........................ 438/287; 438/305; 438/769
[58] Field of Search ..................... 257/900, 408, 257/405, 410, 411; 438/287, 305, 769

[56] References Cited

U.S. PATENT DOCUMENTS

| | | |
|---|---|---|
| 4,356,623 | 11/1982 | Hunter . |
| 4,835,112 | 5/1989 | Pfiester et al. . |
| 5,286,664 | 2/1994 | Horiuchi . |
| 5,369,297 | 11/1994 | Kusunoki et al. . |
| 5,382,533 | 1/1995 | Ahmad et al. . |
| 5,436,482 | 7/1995 | Ogoh . |
| 5,460,992 | 10/1995 | Hasegawa . |
| 5,516,707 | 5/1996 | Loh et al. . |
| 5,554,871 | 9/1996 | Yamashita et al. ............ 257/410 |
| 5,591,681 | 1/1997 | Wristers et al. . |
| 5,648,284 | 7/1997 | Kusunoki et al. ............ 438/287 |
| 5,650,344 | 7/1997 | Ito et al. ...................... 438/287 |
| 5,668,028 | 9/1997 | Bryant et al. ................ 438/287 |
| 5,674,788 | 10/1997 | Wristers et al. . |
| 5,705,439 | 1/1998 | Chang . |
| 5,712,208 | 1/1998 | Tseng et al. ................. 438/287 |
| 5,726,087 | 3/1998 | Tseng et al. ................. 438/287 |
| 5,759,897 | 6/1998 | Kadosh et al. . |
| 5,786,254 | 7/1998 | Hao et al. . |
| 5,827,769 | 10/1998 | Aminzadeh et al. ......... 438/305 |

FOREIGN PATENT DOCUMENTS

| | | | |
|---|---|---|---|
| 4229574 | 3/1993 | Germany .................... 257/410 |
| 4-208570 | 7/1992 | Japan ......................... 257/410 |
| 6-151829 | 5/1994 | Japan ......................... 257/410 |

OTHER PUBLICATIONS

Tsui et al., "Suppression of MOSFET reverse short channel effect by N20 gate poly reoxidation process", International Electron Devices Meeting, pp. 501–504, 1994.

Primary Examiner—Richard A. Booth
Attorney, Agent, or Firm—Conley, Rose & Tayon; Robert C. Kowert; Kevin L. Daffer

[57] ABSTRACT

An integrated circuit is formed whereby transistor gate dielectrics are made less susceptible to hot carrier effects. Barrier atoms are inserted into critical areas to minimize trapping of hot carriers within the gate dielectric. Barrier atoms are incorporated into critical areas within the gate dielectric, primarily at the juncture between the gate dielectric and the overlying gate conductor and underlying substrate. The barrier atoms serve to eliminate bond opportunities of hot carriers injected from the drain area. The barrier atoms are presented by elevating the temperature of the integrated circuit being produced and the barrier-embodied gas surrounding the circuit. The elevated temperatures occur within either an RTA furnace or an oxidizing furnace. Significant is the incorporation of barrier atoms during a normal process flow, either during polysilicon oxidation and/or implant anneal. According to one embodiment, barrier atoms are incorporated after the LDD implant during times in which a polysilicon oxide is grown. According to a second embodiment, barrier atoms are incorporated after the source/drain implant and during anneal of those implant species. In yet another embodiment, barrier atoms are incorporated during each of the above steps.

23 Claims, 4 Drawing Sheets

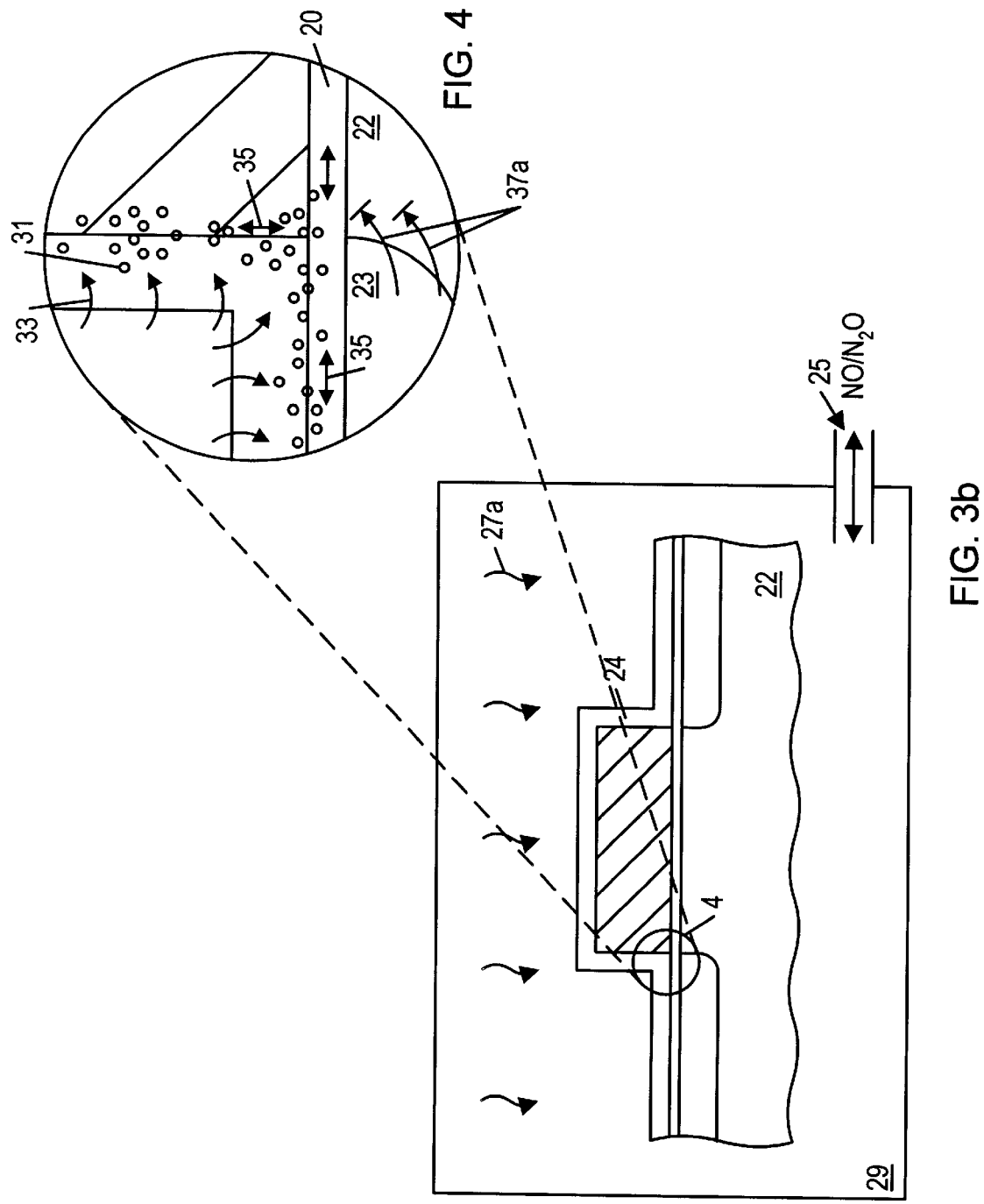

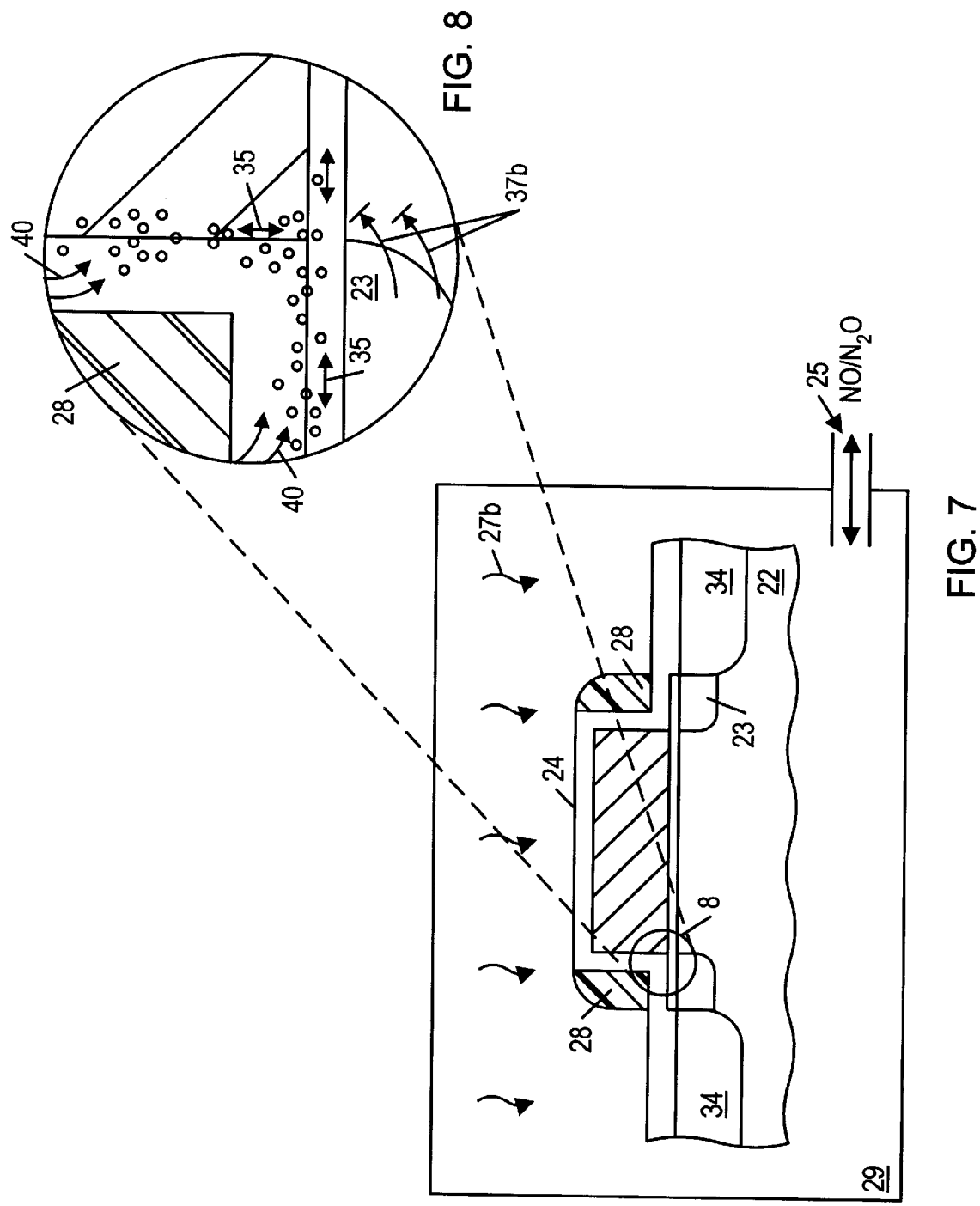

INTEGRATED CIRCUIT GATE CONDUCTOR HAVING A GATE DIELECTRIC WHICH IS SUBSTANTIALLY RESISTANT TO HOT CARRIER EFFECTS

BACKGROUND OF THE INVENTION

1. Field of the Invention

This invention relates to semiconductor fabrication and, more particularly, to an integrated circuit having barrier atoms forwarded into the drain side of a gate dielectric to minimize hot carriers from entering and being trapped therein.

2. Description of Related Art

Fabrication of a metal-oxide semiconductor ("MOS") transistor is well known. The manufacture of an MOS transistor begins by defining active areas where the transistor will be formed. The active areas are isolated from other areas on the semiconductor substrate by various isolation structures formed upon and within the substrate. Isolation structures come in many forms. For example, the isolation structures can be formed by etching trenches into the substrate and then filling the trenches with a dielectric fill material. Isolation structures may also be formed by locally oxidizing the silicon substrate using the well-recognized local oxidation of silicon ("LOCOS") technique.

Once the isolation structures are defined between transistor active areas, a gate dielectric is formed. Typically, the gate dielectric is formed by thermal oxidation of the silicon substrate. Thermal oxidation is achieved by subjecting the substrate to an oxygen-bearing, heated ambient in, for example, an oxidation furnace or a rapid thermal anneal ("RTA") chamber. A gate conductor material is then deposited across the entire dielectric-covered substrate. The gate conductor material is preferably polycrystalline silicon, or polysilicon. The polysilicon layer is then patterned using a photolithography mask. The mask allows selective removal of a light-sensitive material deposited entirely across polysilicon. The material which is exposed can, according to one embodiment, be polymerized, and that which is not exposed removed. Selective polymerization is often referred to as the "develop" stage of lithography. The regions which are non-polymerized are removed using the etch stage of lithography.

An n-channel transistor, or NMOS transistor, must in most instances be fabricated different from a p-channel transistor, or PMOS transistor. NMOS transistors employ n-type dopants on opposite sides of the NMOS gate conductor, whereas PMOS transistors employ p-type dopants on opposite sides of the PMOS transistor gate conductor. The regions of the substrate which receive dopants on opposite sides of the gate conductor are generally referred to as junction regions, and the distance between junction regions is typically referred to as the physical channel length. After implantation and subsequent diffusion of the junction regions, the distance between the junction regions becomes less than the physical channel length and is often referred to as the effective channel length ("Leff"). In high-density designs, not only does the physical channel length become small but so too must the Leff. As Leff decreases below approximately 1.0 $\mu$m, for example, a problem known as short channel effects ("SCE") becomes predominant.

A problem related to SCE, and the subthreshold currents associated therewith, but altogether different is the problem of hot-carrier effects ("HCE"). HCE is a phenomenon by which hot-carriers ("holes and electrons") arrive at or near an electric field gradient. The electric field gradient, often referred to as the maximum electric field ("Em"), occurs near the drain during saturated operation. More specifically, the electric field is predominant at the lateral junction of the drain adjacent to the channel. The electric field at the drain causes primarily electrons in the channel to gain kinetic energy and become "hot". These hot electrons traveling to the drain lose their energy by a process called impact ionization. Impact ionization serves to generate electron-hole pairs, wherein the pairs migrate to and become injected within the gate dielectric near the drain junction. Traps within the gate dielectric generally become electron traps, even if they are partially filled with holes. As a result, there is a net negative charge density in the gate dielectric. The trapped charge accumulates with time, resulting in a positive threshold shift in a NMOS transistor, or a negative threshold shift in a PMOS transistor. It is known that since hot electrons are more mobile than hot holes, HCE causes a greater threshold skew in NMOS transistors than PMOS transistors. Nonetheless, a PMOS transistor will undergo negative threshold skew if its Leff is less than, e.g., 0.8 $\mu$m.

Unless modifications are made to the fabrication sequence, problems resulting from HCE will remain. To minimize these problems, a mechanism must be derived that disperses and thereby reduces Em. That mechanism is often referred to as the double-diffused drain ("DDD") and lightly doped drain ("LDD") techniques. The purpose behind using DDD and LDD structures is to absorb some of the potential into the drain and away from the drain/channel interface. The popularity of DDD structures has given way to LDD structures since DDD causes unacceptably deep junctions and deleterious junction capacitance.

A conventional LDD structure is one whereby a light concentration of dopant is self-aligned to the edge of the gate conductor. The light-dopant concentration is then followed by a heavier-dopant concentration which is self-aligned to a spacer formed on the sidewalls of the gate conductor. The purpose of the first implant dose is to produce a lightly doped section of both the source and drain junction areas at the gate edge near the channel. The second implant dose is spaced from the channel a distance dictated by the thickness of the sidewall spacer. Resulting from the first and second implants, a dopant gradient occurs across the junction from the source/drain area of the junction to the LDD area adjacent the channel.

The LDD implant solves to some extent the HCE problem, but does so at a cost. Dispersion of Em requires that the LDD implant area be sufficiently large near the critical drain-side of the channel. However, due to the symmetrical nature of the LDD implant, the large LDD implant area also occurs near the source-side of the channel. The large area source- and drain-side LDD implants add significant parasitic resistance to the source-drain path of the ensuing transistor. The added parasitic resistance, and, to some extent, capacitance, causes the transistor to operate at a slower speed with higher power consumption than if the LDD area were small or non-existent. Therefore, it appears a trade-off exists between speed and the conventional solution to HCE.

It would be desirable to employ a fabrication process which can minimize HCE but not at the detriment of transistor speed. The desired process must, however, use other means to reduce HCE rather than simply adding to the LDD area or, in the alternative, using junctions which are significantly graded. An improved process is therefore needed which can produce a high-speed transistor without having to incur the complexities associated with multiple implant areas (i.e., grades) within the junction. A graded junction requires the addition of a significant number of processing steps to the overall fabrication sequence.

SUMMARY OF THE INVENTION

The problems outlined above are in large part solved by an improved transistor configuration hereof. The transistor can be either be a PMOS or NMOS transistor; however, it is more advantageous that the transistor be an NMOS transistor since the benefits of the present process are more attuned to HCE as it applies to the more highly mobile hot electrons associated with NMOS transistors.

The present transistor is classified as one having minimal graded junctions (i.e., merely an LDD followed by a source/drain). Instead of using multiple implants exceeding two, the present process minimizes HCE using properly placed barrier atoms. According to one embodiment, the barrier atoms are incorporated prior to forming a spacer on a sidewall surface of the gate conductor. According to an alternative embodiment, barrier atoms are incorporated after the spacer is in place. The gate conductor serves as a mask to the lighter concentration LDD implant. The LDD implant is forwarded into the substrate substantially adjacent the channel region. After the spacer is in place, the spacer along with the gate conductor serves to mask a heavier concentration source/drain implant forwarded into the substrate. The LDD implant may therefore precede the source/drain implant, and the spacer can be retained for the purpose of forming silicide regions according to the well-known self-aligned silicide ("salicide") process.

Barrier atoms are incorporated into critical regions into which and through which hot carriers traverse. The barrier atoms therefore serve to prevent entrapment of the hot carriers within the gate dielectric near the drain-side of the channel. The barrier atoms arise from either a high temperature furnace or a rapid thermal anneal ("RTA") chamber, whereby the heat of the chamber causes the barrier atoms to traverse a dielectric layer on the sidewall surfaces of the gate conductor and enter various disruption sites in or around the gate dielectric.

The disruption sites are presumed to exist primarily between the channel and the overlying gate dielectric as well as between the gate dielectric and the overlying gate conductor. It is contemplated that these disruptions provide an avenue into which the barrier atoms migrate from the furnace or RTA chamber to critical regions existing at the juncture between the LDD implant and the channel. The critical area exists not only within the gate dielectric near the source side of the channel but, more importantly, in the gate dielectric near the drain-side of the channel. By filling the disruptions and opportune bond sites with barrier atoms, the barrier atoms help prevent injection of hot carriers into the gate dielectric from the drain-side of the channel. Thus, the barrier atoms minimize trap opportunities.

Of prime importance in using barrier atoms in critical areas near the drain side of the channel is not only to lessen HCE but to do so without having to add extensive LDDs and various graded junctions often associated with conventional processing techniques. The present LDD area can be quite small compared to conventional designs without suffering the consequences of hot carrier injection and entrapment within the gate dielectric.

According to preferred embodiments, the gate conductor comprises polycrystalline silicon and the dielectric material which covers the gate conductor comprises an oxide grown upon the exposed regions of the polysilicon. The spacer material can be the same material as, or different from, the dielectric material. The spacer material suitably comprises oxide, silicon nitride or polysilicon. Preferably, the barrier atoms comprise atoms having inert electrical and mechanical characteristics, and include atoms selected from the group comprising, e.g., nitrogen, argon, etc.

Broadly speaking, the present invention contemplates an integrated circuit having possibly numerous MOS transistors. Each transistor comprises a gate conductor dielectrically spaced over the semiconductor substrate. The gate conductor has opposed sidewall surfaces on which a dielectric material is formed. Extending from the dielectric material at the sidewall surfaces of the gate conducor is a spacer. The spacer extends a lateral distance defined by a spacer edge. The spacer edge extends from the channel region underlying the gate conductor. Source and drain regions are configured within the semiconductor substrate, each having a lateral perimeter portion approximately aligned with the spacer edge. Lightly doped drain regions are also configured within the semiconductor substrate having a lateral perimeter portion approximately aligned with the lateral surface of the gate conductor sidewall surfaces. Barrier atoms exist within an area of the gate dielectric beneath the sidewall surfaces of the gate conductor to minimize hot carriers from entering the gate dielectric.

The present invention further contemplates a method of forming an integrated circuit. The method comprises growing a gate dielectric upon a semiconductor substrate, followed by patterning a gate conductor on the gate dielectric. The gate conductor has opposed sidewall surfaces which extend across a portion of the gate dielectric. An oxide is then grown in the presence of barrier atoms upon the sidewall surfaces. The oxide is grown to a defined thickness, and the barrier atoms serve to at least partially penetrate the oxide and accumulate at disruption points or bond opportunities in critical regions of the gate dielectric. Thereafter, a spacer may be formed upon the oxide. The gate conductor and the spacer serve as masks during implantation of source and drain implants into the semiconductor substrate. Barrier atoms may be introduced during the anneal phase of the source/drain implants. Thus, barrier atoms may be introduced prior to spacer formation and source/drain implant and/or after spacer formation and source/drain implant. In the former instance, barrier atoms can be introduced during the growth of an oxide on the gate conductor sidewall surface or during an anneal of the pre-existing LDD implant.

Accordingly, the present process introduces barrier atoms either during polysilicon oxidation, during source/drain anneal, or during both polysilicon oxidation and source/drain anneal. The LDD implant occurs prior to polysilicon oxidation, and spacer formation occurs prior to source/drain implant. The barrier species derive from either an oxidation furnace, a non-oxidation furnace, or an RTA chamber. When heated, the barrier species penetrate the oxidized polysilicon and/or the spacer and accumulate at potential trap sites within the gate dielectric. By filling or "plugging" the trap sites, barrier atoms serve to lessen opportunity for hot carrier injection/entrapment and the problems associated therewith.

BRIEF DESCRIPTION OF THE DRAWINGS

Other objects and advantages of the invention will become apparent upon reading the following detailed description and upon reference to the accompanying drawings in which:

FIG. 3b illustrates introduction of barrier atoms into and through the dielectric to critical hot carrier injection avenues according to a processing step subsequent to FIG. 2 or FIG. 3a;

FIG. 4 is a detailed view along the critical area shown as reference numeral 4 of FIG. 3b;

FIG. 7 illustrates introduction of barrier atoms into and through the spacer and dielectric to critical hot carrier injection avenues in addition to or in lieu of the step shown in FIG. 3b, wherein FIG. 7 illustrates a processing step possibly subsequent to FIG. 6; and FIG. 8 is a detailed view along the critical area shown as reference numeral 8 of FIG. 7.

Figure 1:
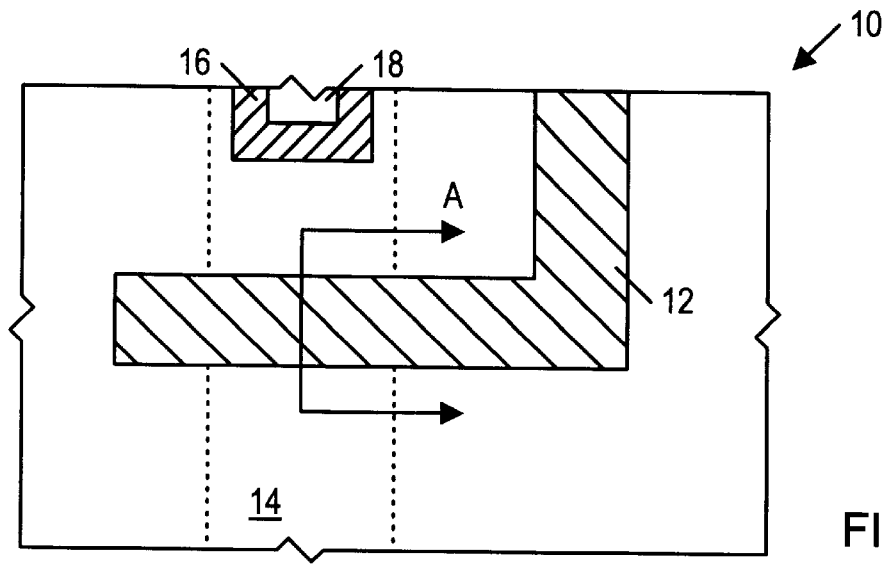
FIG. 1 is a partial plan view of an integrated circuit comprising a transistor formed over an active area.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning now to the drawings, FIG. 1 illustrates a partial top plan view of an integrated circuit 10. Integrated circuit 10 includes numerous features formed upon and within a semiconductor topography. For example, integrated circuit 10 includes numerous active and passive devices. The active devices generally comprise interconnected transistors. Each transistor includes a gate conductor 12 which extends across an active area 14. Active area 14 is defined as a region in which a field dielectric formed by the shallow trench process or the LOCOS process does not exist. Active area 14 is therefore susceptible to receiving junction implants into the semiconductor substrate on opposite sides of gate conductor 12, according to the self-aligned process. The source and/or drain region of active area 14 can be connected to various metal layers extending over active and field regions. An exemplary metal feature 16 and metal contact 18 form electrical connection to an underlying active area 14 as shown.

Figure 2:
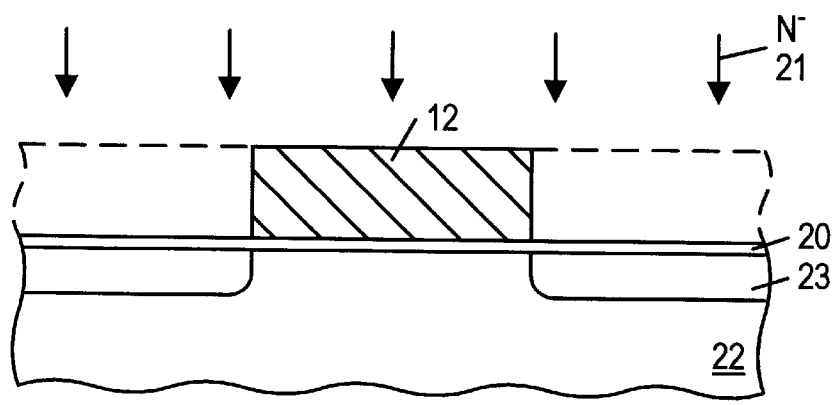
FIG. 2 is a cross-sectional view along plane A of FIG. 1 showing a gate conductor patterned from a layer of gate conductor material followed by an LDD implant self-aligned to the gate conductor according to an initial processing step.

Referring to FIG. 2, a cross-sectional view along plane A of FIG. 1 is illustrated. More specifically, gate conductor 12 is shown having been patterned across select regions of a gate dielectric 20. Gate dielectric 20 is preferably grown into and upon a silicon-based substrate 22. Gate conductor 12 is patterned using well-known lithography techniques whereby a light-sensitive material is deposited upon and thereafter selectively removed from a film bearing gate conductor 12. The exposed portions of the film are then removed using an etch, either a wet etch or a dry (plasma) etch. The etch species is more likely to remove gate conductor material rather than the underlying gate dielectric. The retained regions of the film is shown as gate conductor 12. Once gate conductor 12 is established, gate conductor 12 serves to mask an LDD implant 21 to regions of the substrate 22 defined as LDD implant areas 23. LDD implant 21 comprises n-type species if the ensuing transistor is to be an NMOS transistor. Conversely, LDD implant 21 will comprise p-type species if the ensuing transistor is a PMOS transistor. The concentration (dosage) and implant energies are chosen such that areas 23 will be shallower than, and of lighter concentration than, a subsequent source/drain implant described herein below.

Figure 3A:
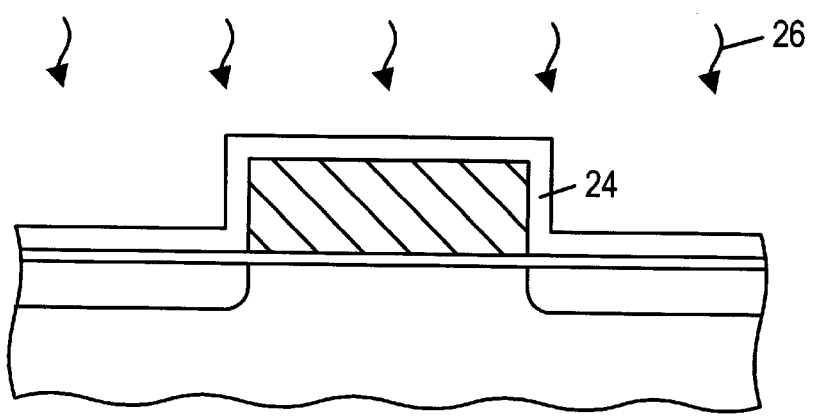
FIG. 3a illustrates a dielectric formed on the gate conductor and semiconductor topography according to one embodiment subsequent to FIG. 2.

Gate conductor 12 preferably comprises polycrystalline silicon. The polycrystalline silicon, herein referred to as "polysilicon," reacts at elevated temperatures with oxygen to form a polycrystalline oxide 24, as shown in FIG. 3a. The thermal energy 26 necessary to form an oxide varies depending upon the amount of oxygen present, and whether the oxygen is sourced from a dry or wet ambient. Polysilicon oxide 24 is henceforth referred to as a dielectric having a concentration of oxygen atoms which varies depending upon the amount of oxygen present in the oxidizing chamber as well as the temperature 26 at which the polysilicon is exposed. The oxidation procedure is carried forth for a sufficient duration to achieve a dielectric thickness which may serve at least two important functions: to minimize ingress of contaminants into the source/drain junction and to minimize channeling of implants within the junction during a subsequent implant process. The presence of dielectric 24 thereby serves as a protectant when heavier, source/drain implantation occurs.

FIG. 3b illustrates a processing step which can be performed in addition to, or in lieu of, the processing step shown in FIG. 3a. More specifically, dielectric 24 can be formed in the presence of a barrier species, along with the oxidizing ambient. FIG. 3a illustrates exposure only to the oxidizing ambient; however, FIG. 3b depicts exposure to an oxidizing ambient in conjunction with a barrier atomic species.

FIG. 3b illustrates the incorporation of barrier atoms into a critical area labeled as reference numeral 4. The barrier atoms enter through a port opening 25 as a gaseous material. The gaseous material is heated along with substrate 22 to allow the barrier atoms to migrate from the gaseous material to the critical area. More specifically, migration occurs through dielectric 24 to areas of disruption comprising irregular bonds, dangling bonds, or layer junctures where abrupt changes in bond organization occur. The thermal energy applied to the gaseous material and to substrate 22 is shown as reference numeral 27a. After reaction has occurred, the barrier-entrained gas is evacuated from chamber 29, allowing the chamber to be opened and a wafer to be removed. According to one embodiment, the barrier-entrained gas comprises nitrogen and oxygen in varying proportions. As such, nitrogen is incorporated into critical area 4. The oxygen serves to form dielectric layer 24 simultaneously with the nitrogen forwarded through the forming dielectric. Thus, FIG. 3b illustrates polysilicon and single crystalline silicon oxidation simultaneous with nitridation. Conversely, FIG. 3a depicts only oxidation. Either process step may be employed. However, if it is desired to incorporate barrier atoms early in the process sequence, then the steps shown in FIG. 3b will be used in lieu of the steps shown in FIG. 3a. The temperature used to oxidize the polysilicon gate conductor and the silicon substrate is substantially the same whether or not a barrier species is present in the oxidizing ambient.

Turning now to FIG. 4, a detailed view along critical area 4 is shown. Specifically, FIG. 4 is an illustration at the atomic level of barrier (e.g., nitrogen) atoms 31 moving along areas 33 and 35. It is contemplated that atoms 31 migrate mostly through dielectric 24 and accumulate at bond disruption sites. Those sites typically occur at the juncture between thin films and, importantly, predominantly at the juncture between gate dielectric 20 and substrate 22. The high mobility of the relatively small nitrogen atoms 31 causes them to readily bond with various bond opportunities at those disruptions. Bonding of nitrogen serves to "plug" hot carrier trap opportunities in critical areas adjacent to the drain side of the channel. As such, hot carriers sourced from the drain side of LDD area 23 are minimized from entering and being trapped at trap sites within gate dielectric 20. Minimization of hot carrier injection and entrapment is achieved by the barrier characteristics of atoms 31 as shown by reference numeral 37a.

Figure 5:
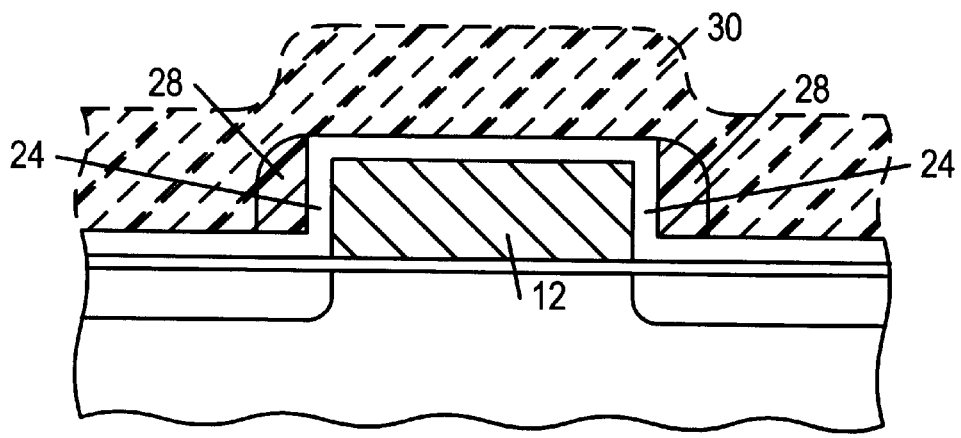
FIG. 5 illustrates formation of a spacer on the dielectric adjacent to the sidewall surfaces according to a processing step subsequent to FIG. 3a or FIG. 3b.

FIG. 5 illustrates formation of a spacer 28 from a spacer material 30 deposited entirely across the ensuing semiconductor topography. Material 30 is preferably chemical vapor deposited (CVD) using numerous well-known techniques. The deposition thickness is varied to account for a desired thickness which would preferably equal if not exceed the thickness of gate conductor 12. After material 30 is deposited, it is then removed at a faster rate along horizontal surfaces than vertical surfaces. The removal process is generally referred to as an "anisotropic" etch process. The etch duration is terminated, however, before the entirety of material 30 is removed. Accordingly, anisotropic etch duration is chosen to remove material from horizontal surfaces but not to remove material from relatively tall, vertical surfaces. Retainage occurs primarily on dielectric 24 sidewall surfaces of gate conductor 12.

Figure 6:
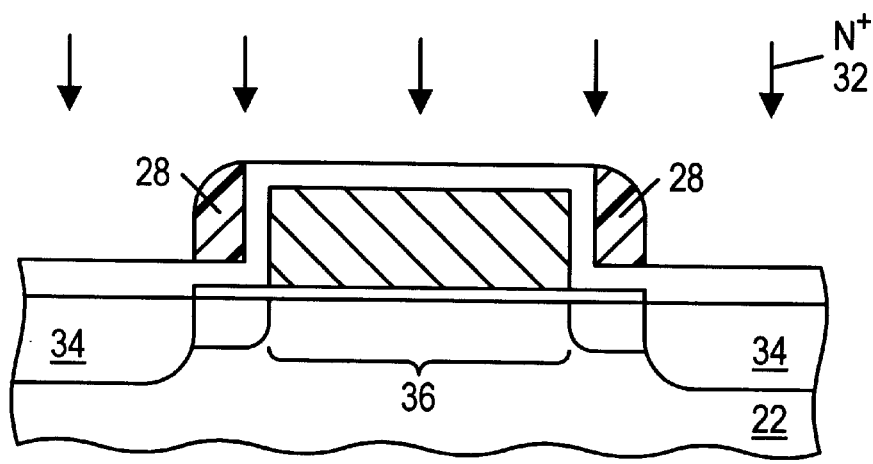
FIG. 6 illustrates source/drain implants forwarded into the semiconductor substrate a spaced distance from the gate conductor according to a processing step subsequent to FIG. 5.

Spacer 28 extends from dielectric 24 a lateral distance sufficient to mask source/drain implants a spaced distance away from gate conductor 12, as shown in FIG. 6. FIG. 6 illustrates source/drain implants, and more specifically, high concentration n-type implants 32 forwarded into substrate 22. Implants 32 thusly forwarded form source/drain regions 34. The source/drain regions are spaced from channel 36 in accordance with the thickness of spacers 28. FIG. 6 illustrates n-type dopants 32 applied in the present sequence to form an NMOS transistor. Barrier atoms may pre-exist, in accordance with the embodiment shown in FIG. 3b, within the critical region of the gate dielectric near the drain-side of channel 36. The pre-existence of barrier atoms serves to block or prevent hot carrier entrapment primarily attributed to NMOS transistors. If channel 36 is quite small, then the source/drain implants can equally apply to p-type dopants since HCE becomes a factor when a PMOS channel length extends less than, e.g., 0.8 $\mu$m.

Another barrier placement step may be used in addition to, or in lieu of, the barrier placement step shown in FIG. 3b. This barrier placement is shown in reference to FIG. 7. Similar to FIG. 3b, FIG. 7 illustrates barrier atoms forwarded from chamber 29 through dielectric 24 and into the critical area 8. Thermal energy 27 is applied to activate movement of the barrier atoms, wherein the barrier atoms may comprise nitrogen received through port opening 25. Port 25 can therefore receive any species which comprises barrier atoms, defined as atoms which occupy regions where hot carriers might travel to and become trapped within gate dielectric 20. Primarily, the barrier atoms exist only near the edges of the channel and not within the gate dielectric entirely across the channel. Thus, the barrier atoms exist in the critical drain side of the channel and therefore do not significantly affect transistor operation.

A primary difference between the processing step shown in FIG. 7 and that shown in FIG. 3b is the incorporation of barrier atoms through the pre-existing spacer 28, as shown in FIG. 7. Realizing that migration through barrier 28 is lessened due to the presence of the barrier, thermal energy 27b of the step shown in FIG. 7 may need to be heightened relative to thermal energy 27a shown in FIG. 3b. Even with relatively low thermal energies, however, some barrier atoms migrate into the critical regions shown by reference numeral 40 of FIG. 8. A higher temperature 27b can be used to drive the barrier atoms without significantly skewing the source/drain area 34. This is due primarily to the distance between area 34 and the channel. Also, the source/drain n-type species may be heavier than the LDD n-type species, allowing a lesser opportunity for thermal migration. It is postulated that migration 40 occurs somewhat around the edges of spacer 28 along the route shown by arrows 35.

A pre-existing spacer 28 lessens potential for barrier ingress. However, the benefits in placing the barrier atoms in either a single step or dual steps with the final step occurring after the spacer is realized occur in a anneal step. Thermal cycle 27b can be made much higher than thermal cycle 27a to not only place the barrier atoms through or around spacer 28 but also to anneal (i.e., activate) the heavier concentration source/drain implants 34. It is generally known that the source/drain implants 34 require a higher temperature anneal than the lighter concentration LDD implants 23. As such, the higher temperature anneal necessary for source/drain implant 32 is beneficially performed simultaneously with the higher temperature needed to place the barrier atoms through or around the pre-existing spacer 28. Barrier atoms 31, shown in FIG. 8, serve to minimize or substantially prevent movement of or entrapment of hot carriers in accordance with reference numeral 37b.

The present sequence affords barrier introduction after LDD implant, after source/drain implant, or after both LDD implant and source/drain implant. Of benefit is the mechanism by which barrier atoms are introduced during what would normally be a thermal oxidation step or an implant anneal step. As such, introduction of barrier atoms takes place during the normal process flow. The process sequence need not be changed or modified to accommodate the barrier atoms. All that need be changed is the introduction of a barrier species during oxidation or anneal.

After the transistor with barrier-entrained atoms is formed, a silicide may be introduced upon silicon-bearing surfaces. To form the silicon surfaces, dielectric 24 may be removed in lieu of spacer 28. Silicide formation therefore occurs after the processing step shown in FIGS. 6 or 7 according to the well-known salicide, two-phase reaction technique. For sake of brevity and clarity of the drawings, the salicide process is not shown, nor is the subsequent metalization layers or interlevel dielectrics. However, it is to be understood that an integrated circuit which utilizes the present process will have those subsequent fabrication steps.

It will be appreciated to those skilled in the art having the benefit of this disclosure that this invention is believed to be capable of forming MOS transistors which are less susceptible to HCE problems. It is to be understood that the form of the invention shown and described is to be taken as exemplary, presently preferred embodiments. Various modifications and changes may be made to each and every processing step without departing from the spirit and scope of the invention given the benefit of this disclosure as set forth in the claims. It is intended that the following claims be interpreted to embrace all such modifications and changes and, accordingly, the specification and drawings are to be regarded in an illustrative rather than a restrictive sense.

What is claimed is:

1. A method for forming an integrated circuit, comprising:

growing a gate dielectric upon a semiconductor substrate;

patterning a gate conductor to have exposed sidewall surfaces opposed across a portion of said gate dielectric;

growing an oxide in the presence of first barrier atoms to a first defined thickness upon said exposed sidewall surfaces;

forming a spacer to a second defined thickness upon said oxide;

using said gate conductor, said oxide, and said spacer as a mask, implanting a source area and a drain area into said semiconductor substrate; and subsequent said implanting, annealing said semiconductor substrate in the presence of second barrier atoms.

2. The method as recited in claim 1 wherein said growing said oxide comprises introducing said barrier atoms into said gate dielectric proximate to said sidewall surfaces of said gate conductor.

3. The method as recited in claim 1 wherein said growing said oxide comprises heating said gate conductor in the presence of a nitrogen-bearing gas.

4. The method as recited in claim 3 wherein said growing said oxide further comprises introducing said nitrogen into said gate dielectric proximate to said sidewall surfaces of said gate conductor.

5. The method as recited in claim 1, said annealing comprising forwarding said second barrier atoms through said spacer into said gate dielectric proximate to one of said sidewall surfaces of said gate conductor.

6. The method as recited in claim 1 wherein said first barrier atoms and said second barrier atoms comprise the same chemical element.

7. The method as recited in claim 6 wherein said chemical element is nitrogen.

8. The method as recited in claim 1 wherein said first barrier atoms and said second barrier atoms comprise different chemical elements.

9. The method as recited in claim 8 wherein one of said chemical elements is nitrogen.

10. The method as recited in claim 1 wherein said implanting a source area and a drain area comprises implanting a first dopant into said semiconductor substrate a first spaced distance form said sidewall surfaces, said first spaced distance being substantially equal to a combined thickness of said spacer and said oxide.

11. The method as recited in claim 10, further comprising forming a lightly doped drain area prior to forming said spacer, wherein said forming comprises implanting a second dopant of lesser concentration and energy than said first dopant into said semiconductor substrate a second spaced distance from said sidewall surfaces, said second spaced distance being substantially equal to the thickness of said oxide.

12. The method as recited in claim 1 wherein said gate conductor is patterned from a layer of polycrystalline silicon.

13. The method as recited in claim 1 wherein said forming a spacer comprises:

depositing a layer of nitride upon said oxide; and anisotropically removing said layer of nitride except upon the oxide arranged immediately adjacent sidewall surfaces of said gate conductor.

14. The method as recited in claim 1 wherein said annealing comprises heating said semiconductor topography simultaneously with forwarding a plurality of nitrogen atoms from a nitrogen-bearing ambient through said spacer and into an area of the gate dielectric beneath one of said sidewall surfaces to minimize the number of hot carriers entering said gate dielectric.

15. The method as recited in claim 14 wherein a predominant portion of said nitrogen atoms bond with oxygen atoms within said gate dielectric near the interface between said gate dielectric and a lateral perimeter of said gate conductor.

16. A method for forming an integrated circuit, comprising:

growing a gate dielectric upon a semiconductor substrate;

patterning a gate conductor between opposed sidewall surfaces across a portion of said gate dielectric;

growing an oxide to a first defined thickness upon said sidewall surfaces;

forming a spacer to a second defined thickness upon said oxide;

using said gate conductor and said spacer as a mask, implanting a source area and a drain area into said semiconductor substrate; and subsequent to said implanting said source area and said drain area, annealing said semiconductor substrate in the presence of a barrier-entrained gas, wherein said barrier-entrained gas comprises barrier atoms and oxygen.

17. The method as recited in claim 16, further comprising forming a lightly doped drain area prior to forming said spacer.

18. The method as recited in claim 17, said implanting a source area and a drain area comprising implanting a first dopant into said semiconductor substrate a first spaced distance from said sidewall surfaces, said first spaced distance being substantially equal to a combined thickness of said spacer and said oxide, said forming a lightly doped drain area comprising implanting a second dopant of lesser concentration and energy than said first dopant into said semiconductor substrate a second spaced distance from said sidewall surfaces, said second spaced distance being substantially equal to a thickness of said oxide.

19. The method as recited in claim 17 wherein said barrier atoms comprise nitrogen.

20. The method as recited in claim 16 wherein said gate conductor is patterned from a layer of polycrystalline silicon.

21. The method as recited in claim 16 wherein said forming a spacer comprises:

depositing a layer of nitride upon said oxide; and anisotropically removing said layer of nitride except upon the oxide arranged immediately adjacent sidewall surfaces of said gate conductor.

22. The method as recited in claim 16 wherein said annealing comprises heating said semiconductor topography simultaneous with forwarding a plurality of nitrogen atoms from said barrier-entrained gas through said spacer and into an area of the gate dielectric beneath one of said sidewall surfaces to minimize hot carriers from entering said gate dielectric.

23. The method as recited in claim 22 wherein a predominant portion of said nitrogen atoms bond with oxygen atoms within said gate dielectric near the interface between said gate dielectric and a lateral perimeter of said gate conductor.

* * * * *